United States Patent [19]

Sekiwa

[11] Patent Number: 5,172,195
[45] Date of Patent: Dec. 15, 1992

[54] DOUBLE HETEROSTRUCTURE GAALAS 610-640 NM LED

[75] Inventor: Tetsuo Sekiwa, Kawasaki, Japan

[73] Assignee: Kabushiki Kaisha Toshiba, Kawasaki, Japan

[21] Appl. No.: 686,511

[22] Filed: Apr. 17, 1991

[30] Foreign Application Priority Data

Apr. 18, 1990 [JP] Japan .................................. 2-102133
Apr. 19, 1990 [JP] Japan .................................. 2-103532
Mar. 22, 1991 [JP] Japan .................................. 3-059050

[51] Int. Cl.⁵ ............................................ H01L 33/00
[52] U.S. Cl. ..................................... 257/96; 257/101; 257/102
[58] Field of Search .................... 357/16, 17, 90, 30

[56] References Cited

U.S. PATENT DOCUMENTS

| | | | |
|---|---|---|---|
| 4,984,242 | 1/1991 | Scifres et al. | 357/17 |
| 4,992,837 | 2/1991 | Sakai et al. | 357/17 |
| 4,999,316 | 3/1991 | Goodhue et al. | 357/17 |
| 4,999,844 | 3/1991 | Imamoto | 357/17 |
| 5,020,066 | 5/1991 | Iga et al. | 357/17 |
| 5,027,169 | 6/1991 | Takahashi et al. | 357/17 |
| 5,073,806 | 12/1991 | Idei | 357/17 |
| 5,077,588 | 12/1991 | Yamada et al. | 357/17 |
| 5,103,270 | 4/1992 | Sato et al. | 357/16 |

FOREIGN PATENT DOCUMENTS

61-54618  3/1986  Japan .

*Primary Examiner*—Andrew J. James
*Assistant Examiner*—Daniel N. Russell
*Attorney, Agent, or Firm*—Foley & Lardner

[57] ABSTRACT

A light emitting device having: a first GaAlAs clad layer of a first conductivity type having a first AlAs mixed crystal ratio, the first GaAlAs clad layer serving as a first layer of the device; a GaAlAs active layer having a second AlAs mixed crystal ratio different from the first AlAs mixed crystal ratio, the second AlAs mixed crystal ratio being set to a value necessary for light emission wavelength within a range of 610 nm to 640 nm, the GaAlAs active layer serving as a second layer of the device; and a second GaAlAs clad layer of a second conductivity type having a third AlAs mixed crystal ratio different from the second AlAs mixed crystal ratio, the second GaAlAs clad layer serving as a third layer of the device, wherein the GaAlAs active layer of the first conductivity type serving as said second layer is sandwiched between the first GaAlAs clad layer of the first conductivity type serving as the first layer and the second GaAlAs clad layer of the second conductivity type serving as the third layer, to constitute a double hetero structure. The second AlAs mixed crystal ratio is 0.4 to 0.56, while the third mixed crystal value ratio is 0.75 to 0.85.

33 Claims, 6 Drawing Sheets

DOUBLE HETEROSTRUCTURE GAALAS 610-640 NM LED

FIELD OF THE INVENTION

The present invention relates to a light emitting device using GaAlAs and a method of manufacturing the same, and more particularly to a light emitting device suitable for obtaining a high luminance of light near the visible light range (emitted light wavelength $\lambda_p = 610$ to 640 nm) and a method of manufacturing the same.

BACKGROUND OF THE INVENTION

The term "AlAs mixed crystal ratio" used hereinbelow means an AlAs mixed crystal ratio relative to a GaAs crystal. For example, an AlAs mixed crystal ratio 0.7 means a composition of $Ga_{0.3}Al_{0.7}As$.

Figure 1:
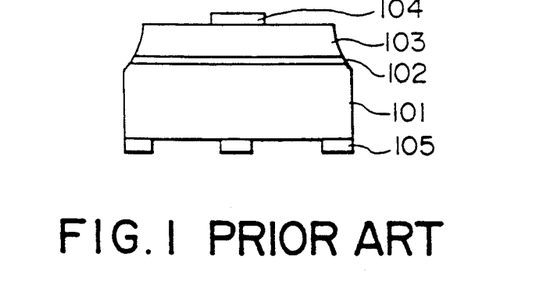
FIG. 1 is a cross sectional view of a first conventional light emitting device.

FIG. 1 illustrates a semiconductor light emitting device having a double hetero structure. This light emitting device is grown on a GaAs substrate by means of a liquid phase epitaxial growth method. The GaAs substrate is removed from a final pellet.

Specifically, a p-type clad layer 101 having an AlAs mixed crystal ratio 0.7 and added with zinc (Zn) is grown on a GaAs substrate (not shown). A p-type GaAlAs active layer 102 is grown on the clad layer 101, the p-type GaAlAs active layer 102 having an AlAs mixed crystal ratio necessary for obtaining an emitted light wavelength 660 nm and added with zinc (Zn). On this active layer 102 there is grown an n-type GaAlAs clad layer 103 having an AlAs mixed crystal ratio generally the same as that of the p-type GaAlAs clad layer 101 and added with tellurium (Te). The clad layer 103 is provided with an n-type partial ohmic contact electrode 104. The clad layer 101 is provided with p-type partial ohmic contact electrodes 105.

Figure 2:
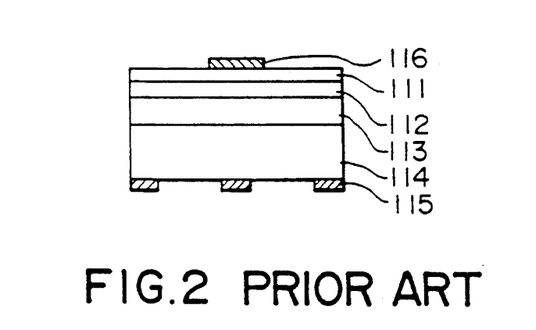
FIG. 2 is a cross sectional view of a second conventional light emitting device.

FIG. 2 is a cross sectional view showing the structure of a second example of a conventional light emitting device. As seen from FIG. 2, an n-type grown layer 113 is formed on an n-type GaP substrate 114 by means of a vapor phase growth (VG) method. In forming this layer 113, an n-type GaP mixed crystal ratio is graded so as to obtain a predetermined emitted light wavelength ($\lambda_p = 630$ nm, $GaAs_{0.35}P_{0.65}$). On the layer 113 there is formed an n-type $GaAs_{0.35}P_{0.65}$ grown layer 112 containing nitrogen serving as light emission center. The GaP mixed crystal ratio of this layer 112 is maintained constant. Thereafter, by means of a zinc diffusion method, zinc is diffused from the surface of the n-type layer 112. A p-type $GaAs_{0.35}P_{0.65}$ zinc diffused layer 111 having the constant GaP mixed crystal ratio is thereby formed on the layer 112, constituting a p-n junction. The layer 111 is formed with a p-type ohmic contact electrode 116. The substrate 114 is formed with n-type partial ohmic contact electrodes 115. In this way, a light emitting device having an emitted light wavelength of 630 nm is obtained. When current is applied to this device through the n-type partial ohmic contact electrodes 115 and the p-type ohmic contact electrode 116, visible light having an emitted light wavelength 630 nm can be obtained.

The GaAlAs light emitting device having a double hetero structure shown in FIG. 1 is commercially available as a red (emitted light wavelength: 660 nm) light emitting device having a high luminance its turn-on/off can be visually recognized even outdoors or under high illuminance.

However, light having a wavelength 660 nm dazzles and irritates human eyes giving a visually dangerous tone. Therefore, it is desirable to shorten the emitted light wavelength, e.g., to about 630 nm. It is especially desirable to shorten the emitted light wavelength of stop lamps of a car to about 630 nm.

The emitted light wavelength can be shortened by changing the AlAs mixed crystal ratio of the active layer while using the double hetero structure shown in FIG. 1. However, this approach results in insufficient luminance making it difficult to visually recognize turn-on/off of the device outdoors or under high illuminance.

The second example of the conventional light emitting device shown in FIG. 2 has been constructed as described above. The light emission efficiency of such a device having a size of 0.3 mm × 0.3 mm is 0.3% or less at an energizing current 20 mA. Therefore, light output becomes insufficient outdoors or under bright illumination making it very difficult to visually recognize if the device is being turned on or off.

SUMMARY OF THE INVENTION

In view of the limitations of the above discussed related art, it is an object of the present invention to provide a light emitting device capable of obtaining high efficiency of light emission near visible light having an emitted light wavelength 630 nm and to provide a method of manufacturing the same. Such high efficiency would not be expected from conventional techniques. The device and method were obtained by experiments which the inventors carried out.

According to one aspect of the present invention, there is provided a light emitting device comprising:

a first GaAlAs clad layer of a first conductivity type having a first AlAs mixed crystal ratio, the first GaAlAs clad layer serving as a first layer of the device;

a GaAlAs active layer having a second AlAs mixed crystal ratio different from the first AlAs mixed crystal ratio, the second AlAs mixed crystal ratio being set to a value necessary for light emission of 610 nm to 640 nm, the GaAlAs active layer serving as a second layer of the device; and a second GaAlAs clad layer of a second conductivity type having a third AlAs mixed crystal ratio different from the second AlAs mixed crystal ratio, the second GaAlAs clad layer serving as a third layer of the device, wherein the GaAlAs active layer of the first conductivity type serving as said second layer is sandwiched between the first GaAlAs clad layer of the first conductivity type serving as the first layer and the second GaAlAs clad layer of the second conductivity type serving as the third layer, to constitute a double hetero structure.

DESCRIPTION OF THE PREFERRED EMBODIMENTS

Figure 3:
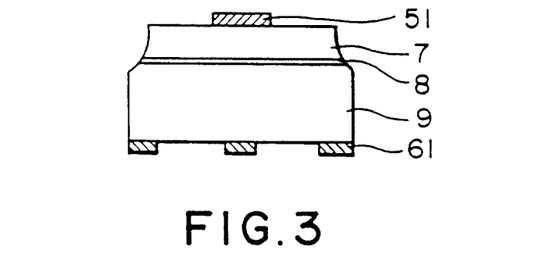
FIG. 3 is a cross sectional view of a light emitting device according to an embodiment of this invention.

FIG. 3 is a cross sectional view of a light emitting device according to an embodiment of this invention. As seen from FIG. 1, the light emitting device of this embodiment is constructed such that an epitaxial wafer having a double hetero structure (DH structure) is formed and an n-type ohmic contact electrode 51 and p-type partial ohmic contact electrodes 61 are formed on the epitaxial wafer. The epitaxial wafer is constructed of a p-type Zn-added GaAlAs clad layer 9, a p-type Zn-added GaAlAs active layer 8, and an n-type Te-added GaAlAs clad layer 7. The partial electrodes 61 are formed in a pattern of dots covering about 20% of the bottom surface of the clad layer 9. The p-type Zn-added GaAlAs clad layer 9 is a p-type $Ga_{0.2}Al_{0.8}As$ grown clad layer, the p-type Zn-added GaAlAs active layer 8 is a p-type $Ga_{0.75}Al_{0.425}As$ grown active layer, and the n-type Te-added GaAlAs clad layer 7 is a $Ga_{0.2}Al_{0.8}As$ grown clad layer. Zinc (Zn) is used as p-type impurity, and tellurium (Te) is used as n-type impurity. The p-type ohmic electrode may use Au and Au/Be, and the n-type partial ohmic electrode may be Au/Ge.

Figure 5:
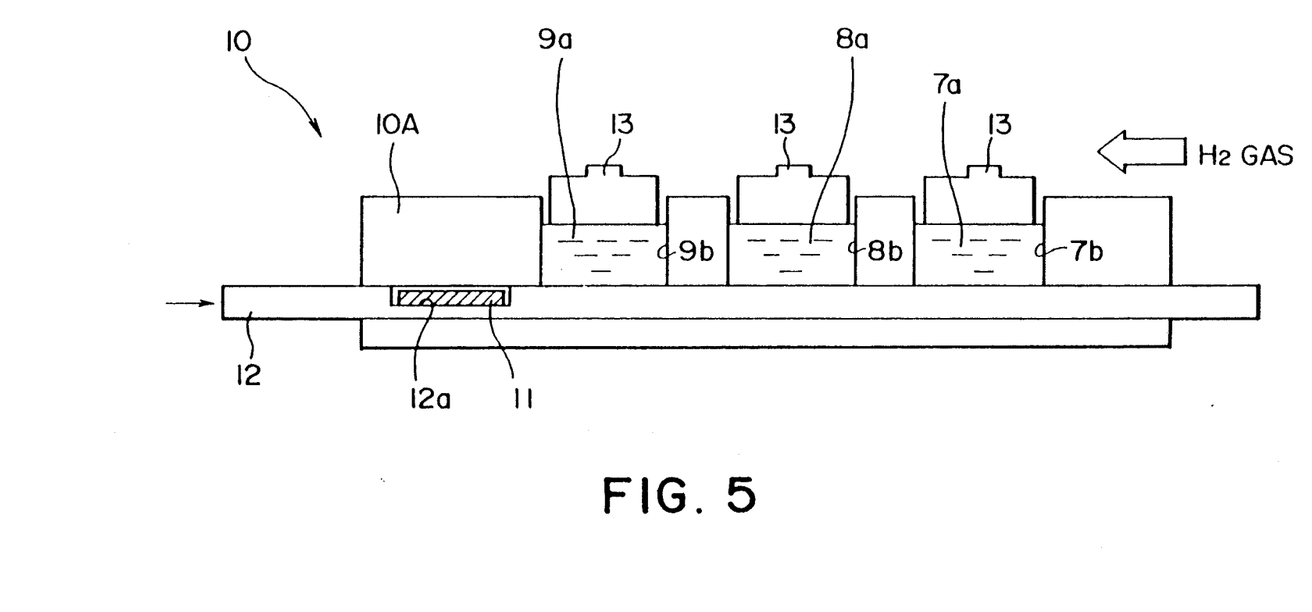
FIG. 5 illustrates a method of manufacturing the light emitting device shown in FIG. 3.

In practicing the method of manufacturing the light emitting device shown in FIG. 3, a liquid phase epitaxial growth is carried out using a boat 10 having a structure as shown in FIG. 5. This boat 10 has three liquid reservoirs 7b, 8b and 9b formed within a boat main body 10A. A GaAs substrate housing slide plate 12 having a trench 12a within which a p-type GaAs substrate 11 is housed, slides in the direction indicated by an arrow along the boat main body 10A while maintaining a liquid tight state therebetween. Therefore, the substrate 11 becomes sequentially in contact with p-type GaAlAs clad layer growth solution 9a, p-type GaAlAs active layer growth solution 8a, and n-type GaAlAs clad layer growth solution 7a, respectively within the three reservoirs. Each solution 9a, 8a, 7a is covered with a growth solution upper lid 13. The composition of the p-type GaAlAs clad layer growth solution 9a is Al 1.29 g, polycrystalline GaAs 6.98 g, Ga 150 g, and added Zn 20 to 200 mg allowing an acceptor concentration of 0.5 to 5 ($\times 10^{17} cm^{-3}$). The composition Of the p-type GaAlAs active layer growth solution 8a is Al 0.68 g allowing an emitted light wavelength of 630 nm, polycrystalline GaAs 12.1 g, Ga 150 g, and added Zn 20 to 200 mg allowing an acceptor concentration of 1 to 8 ($\times 10^{17} cm^{-3}$). The composition of the n-type GaAlAs clad layer growth solution 7a is Al 1.92 g, polycrystalline GaAs 6.98 g, Ga 150 g, and added Te 1 to 4 mg allowing a donor concentration of 0.5 to 4 ($\times 10^{17} cm^{-3}$).

Figure 6:
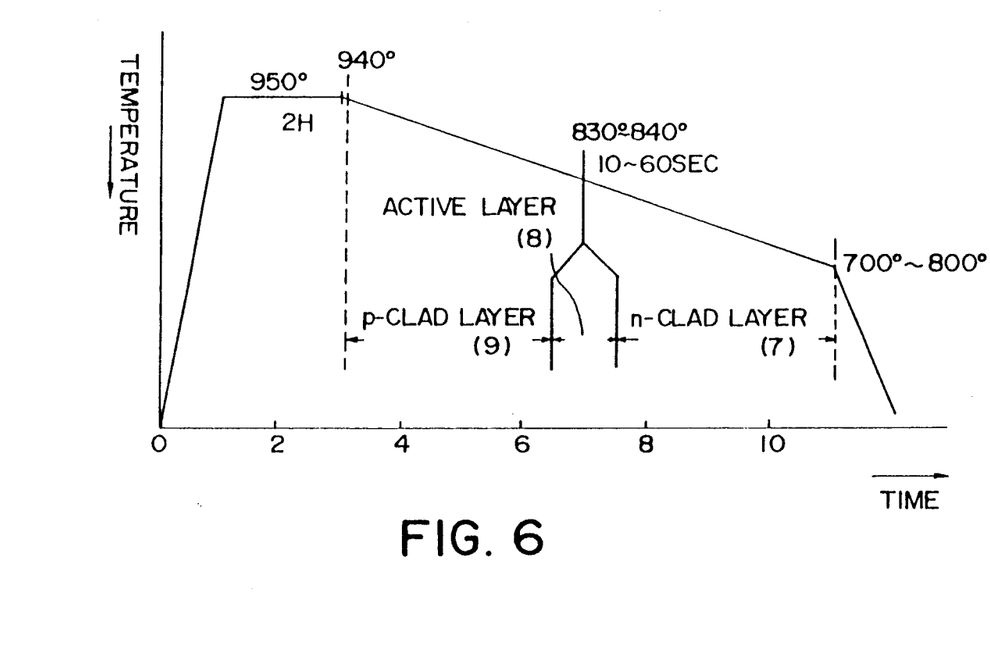
FIG. 6 is a temperature program diagram used with the manufacturing method illustrated in FIG. 5.

Under the above conditions and under an environment in which high purity hydrogen gas $H_2$ flows, as shown in FIG. 5, crystal growth was carried out while controlling the temperature in accordance with the temperature program shown in FIG. 6. The thickness of the p-type Zn-added GaAlAs clad layer 9 depends on the temperature and time that the growth solution 9a and GaAs substrate 11 maintain contact with each other. The thickness of the p-type Zn-added GaAlAs active layer 8 depends on the temperature and time that the active layer growth solution 8a and the clad layer 9 maintain contact with each other. The thickness of the n-type Te-added GaAlAs clad layer 7 depends on the temperature and time that the active layer 8 and the growth solution 7a maintain contact with each other. With the above conditions being set optimum, the p-type Zn-added GaAlAs clad layer 9 can be set to 5 to 200 μm, the p-type Zn-added GaAlAs active layer 8 to 0.1 to 5 μm, and the n-type Te-added GaAlAs clad layer 7 to 20 to 90 μm.

More in particular, the active layer growth solution 8a, clad layer growth solutions 9a and 7a, respectively having the above-described compositions, and the p-type GaAs substrate 11 are set in the boat 10. Thereafter, the boat 10 is placed at a predetermined position within a resistive heater furnace. Under an environment in which high impurity hydrogen gas ($H_2$ gas) flows, the furnace temperature is raised to 950° C. This temperature is held for 2 hours. After 2 hours, the temperature is lowered at a rate of 0.5° C./min. When the temperature is lowered to 940° C., the p-type clad layer growth solution 9a is made to contact substrate 11. Under this condition, the temperature continues to be lowered at the same rate to 840° C. Then, in place of the p-type clad layer growth solution 9a, the active layer growth solution 8a is placed in contact. Thereafter, the temperature continues to be lowered at 0.5° C./min. After the lapse of 30 seconds, in place of the active layer growth solution 8a, the n-type clad layer growth solution 7a is placed in contact. Thereafter, the temperature is lowered to 800° C. at 0.5° C./min.

Using the above processes, it is possible to sequentially grow the p-type GaAlAs clad layer 9, p-type GaAlAs active layer 8, and n-type GaAlAs clad layer 7, on the p-type GaAs substrate 11. The control of the thickness of each layer 7 to 9 and the AlAs mixed crystal ratio is important for realizing the stable characteristics of the invention. The inventors have discovered that it is essential that the saturation temperature of each solution be higher than the temperature used when each solution is placed in contact, and lower than the maximum temperature of the furnace (in the above embodiment, 950° C.). The above-described compositions are determined in accordance with such discovery.

In the above manner, an epitaxial wafer can be obtained. Thereafter, the GaAs substrate 11 is selectively removed, for example, by using $NH_4OH+H_2O_2$-based solution. Thereafter, on the surfaces of the grown layers 9 and 7, the p-type partial ohmic contact electrodes 61 and the n-type ohmic contact electrode 51 are formed, respectively. A mesa etching is then carried out starting from the surface of the n-type Te-added GaAlAs clad layer 7 and extending over the p-n junction, and the device is separated by dicing it.

In FIG. 6, the temperature gradient is set at 0.5° C. while the layers 9, 8, and 7 are formed. This gradient may be set at 0.1 to 5.0° C./min. If the temperature gradient is changed, it becomes necessary to change the time that the substrate 11 is in contact with each solution 9a, 8a, 7a. The time that the substrate 11 remain in contact with the solution 9a is about 2 hours when the temperature gradient is 0.5° C./min. as shown in FIG. 6. This time is set to about 1 hour if the temperature gradient is set at 1.0° C./min., for example.

Figure 7A:
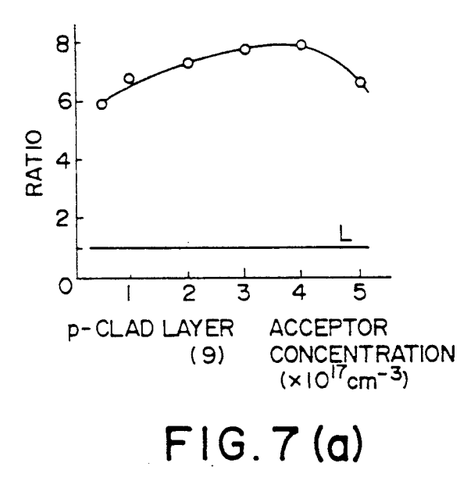
FIGS. 7(a) to 7(d) are diagrams showing the light emission efficiency relative to an impurity concentration of each layer and its thickness.
Figure 7B:
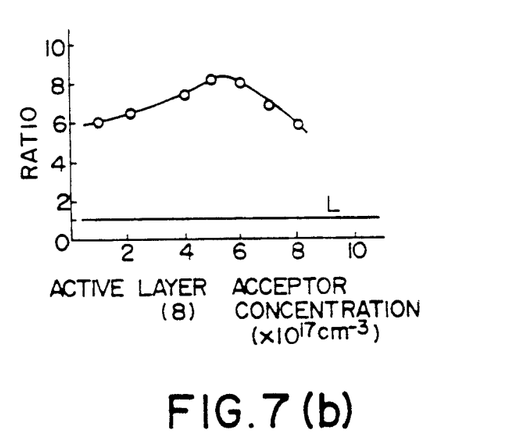
Figure 7C:
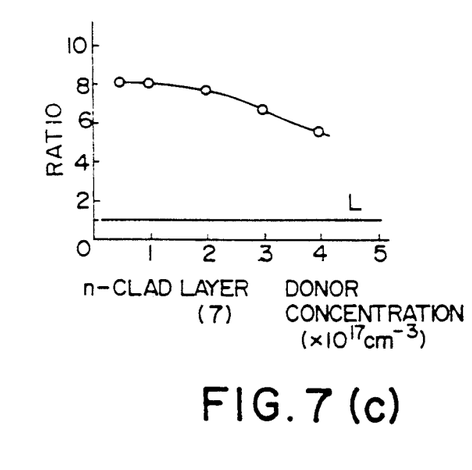
Figure 7D:
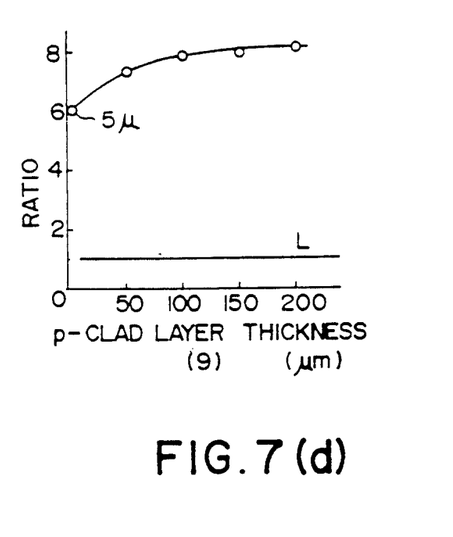
Figure 8A:
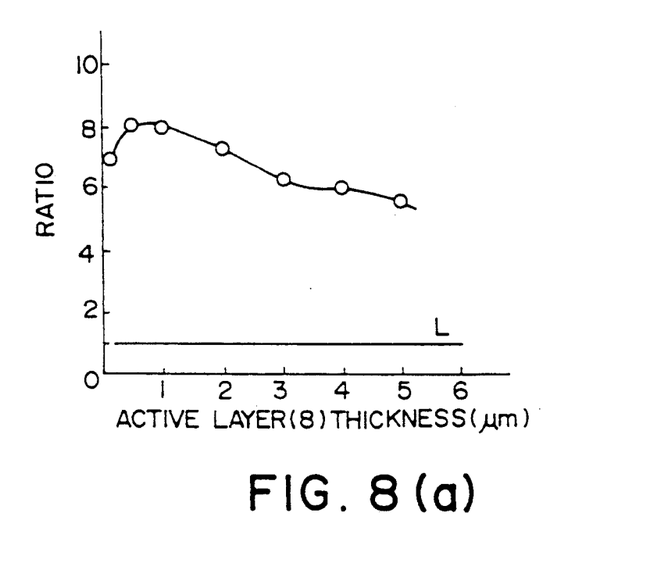
FIGS. 8(a) and 8(b) are diagrams showing the light emission efficiency relative to an impurity concentration of each layer and its thickness.
Figure 8B:
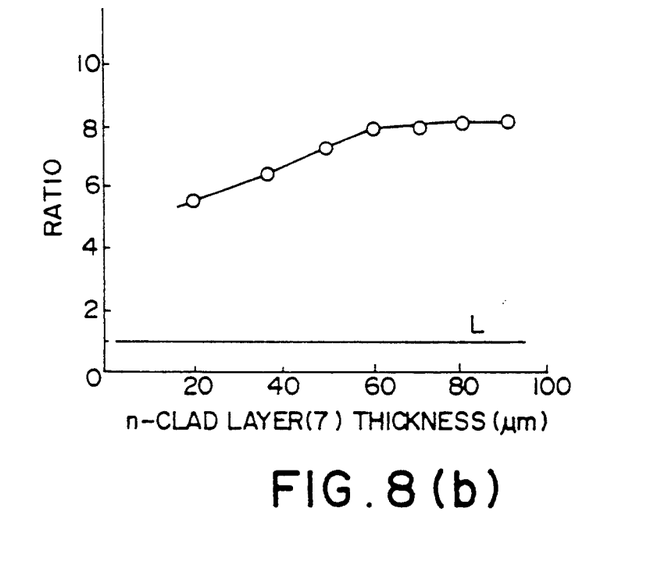

The advantageous effects of the light emitting device having the above-described structure are described with respect to the impurity concentration and thickness of each layer, by referring to FIGS. 7(a) to 7(d), and FIGS. 8(a) and 8(b). In the figures, L represents a GaAsP light emission efficiency. According to the embodiment, the device has a double hetero structure so that the effect of trapping sufficient electrons implanted into the p-type active layer is provided, thereby improving the light emission efficiency. As shown in FIGS. 7(a) to 7(d) and FIGS. 8(a) and 8(b), a light emission efficiency six to eight times higher than conventional can be obtained if proper densities and layer thicknesses are set. Namely, as shown in FIG. 7(b), the density of Zn (acceptor) in the p-type Zn-added GaAlAs active layer 8 is controlled to be 1 to 8 ($\times 10^{17} cm^{-3}$). As shown in FIG. 7(a), the density of Zn (acceptor) in the p-type Zn-added GaAlAs Clad layer 9 is set to 0.5 to 5 ($\times 10^{17} cm^{-3}$). As shown in FIG. 7(c), the density of Te (donor) in the n-type Te-added GaAlAs clad layer 7 is set to 0.5 to 4 ($\times 10^{17} cm^{-3}$). As shown in FIG. 7(d), the thickness of the p-type Zn-added GaAlAs clad layer 9 is set to 5 to 200 $\mu$m, preferably 120 to 200 $\mu$m. As shown in FIG. 8(a), the thickness of the p-type Zn-added GaAlAs active layer 8 is set to 0.1 to 5 $\mu$m. As shown in FIG. 8(b), the thickness of the n-type Te-added GaAlAs clad layer 7 is set to 20 to 90 $\mu$m, preferably 35 to 70 $\mu$m. The reason why the thickness of the n-type clad layer 7 is preferably 35 to 70 $\mu$m is as follows. If the n-type clad layer from which light is picked up is too thick, light emission within the clad layer is absorbed. On the other hand, if it is too thin, it is not possible to sufficiently diffuse current, so that the light emission efficiency at the active layer 8 is lowered. From the above reason, it is preferable that the thickness of the n-type clad layer 7 be 35 to 70 $\mu$m. In this manner, by optimally controlling each layer concentration and thickness, a light emitting device having high efficiency and high luminance characteristics can be obtained as shown in FIGS. 7(a) to 7(d) and FIGS. 8(a) and 8(b). The light emission efficiency being 1.8 to 2.4% (conduction current 20 mA) is six to eight times higher than that of a conventional GaAsP light emitting device.

The following fact can be gleaned from FIG. 7(a). If the acceptor concentration of the p-type clad layer is too high, the absorption of light therein becomes great, thus lowering the light emission efficiency. If the concentration is made high using Zn as an acceptor, Zn may evaporate from the liquid reservoir so that the solutions within the other liquid reservoirs are contaminated. On the other hand, if the acceptor concentration is too low, it is difficult to obtain an ohmic contact. The following fact can be gleaned from FIG. 7(c). Since the p-type clad layer is used as a mount surface, the greater the thickness, the better it becomes. However, a thick layer requires a long growth time, so that it is not practical to set the thickness too great. On the other hand, if the p-type clad layer is thin, silver paste used for the mount may creep upward, thereby lowering manufacturing yield. Furthermore, the following fact can be gleaned from FIG. 7(d). Namely, if the donor concentration of the n-type clad layer is too high, crystallization becomes poor, providing many centers that are not light-emitting and lowering the light emission efficiency. On the other hand, if the concentration is too low, it becomes difficult to have an ohmic contact.

According to this embodiment of the invention, it is not only possible to set the densities of the clad layers 9 and 7 at partial regions near the active layer 8, so as to obtain an optimum light emission output, but also to set the surface density equal to or higher than $5 \times 10^{17} cm^{-3}$ which allows a good ohmic contact characteristic. For these reasons, the light emitting device of this embodiment of the invention has an excellent light emission characteristic, and considerably stable electric characteristics.

Preferably, the impurity concentration and thickness of each layer of the light emitting device take the following values. The concentration of zinc within the p-type GaAlAs Clad layer 9 is $5 \times 10^{17} cm^{-3}$ at the surface on the side of the ohmic partial electrodes 61, and 0.5 to $5 \times 10^{17} cm^{-3}$ near the active layer 8. The AlAs mixed crystal ratio of the active layer 8 is set so that the emitted light wavelength is 625±15 nm. The impurity concentration of zinc within the active layer 8 is 1 to $8 \times 10^{17} cm^{-3}$. The impurity concentration of tellurium within the n-type GaAlAs clad layer 7 is 0.5 to $4 \times 10^{17} cm^{-3}$ near the active layer 8, and $5 \times 10^{17} cm^{-3}$ at the surface on the ohmic electrode 51 side. The thickness of each grown layer 9, 8, 7 is 5 to 200 $\mu$m for the p-type clad layer 9, 0.1 to 5 $\mu$m for the p-type active layer 8, and 20 to 90 $\mu$m for the n-type clad layer 7.

As described above, the impurity concentrations at the surfaces of the p-type clad layer 9 and the n-type clad layer 7 are required to be high, so as to provide ohmic contacts. The high impurity density can be obtained automatically as described above in accordance with the temperature gradient of the substrate, while using as impurities Zn and Te. Mg and S may be used in place of Zn and Te, respectively. In this case, the impurity addition quantity is controlled so that a desired impurity concentration of each layer 9, 7 can be obtained.

Figure 4:
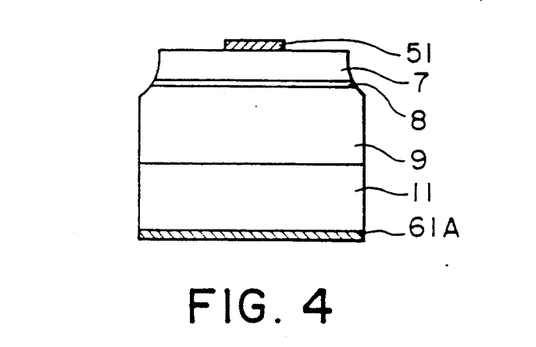
FIG. 4 is a cross sectional view of a light emitting device according to another embodiment of this invention.

The device shown in FIG. 3 illustrates a structure in which the p-type GaAs substrate 11 is removed at the final process. In contrast with this, the device may have a structure in which the p-type GaAs substrate is not removed, as shown in FIG. 4. In FIG. 4, reference numeral 11 represents a p-type GaAs substrate, and 61A represents a whole-area type p-type ohmic electrode. With such an arrangement, manufacturing yield of pellets can be considerably improved. The light emission efficiency of this device can be obtained at 0.6 to 0.9%, two to three times higher than a conventional GaAsP light emitting device. Also in this case, it is possible to realize higher efficiency and luminance than the conventional device.

The AlAs mixed crystal ratios of the solutions 9a and 7a (clad layers 9 and 7) are 0.8. In Table 1, with the AlAs mixed crystal ratios from 0.7 to 0.9, are shown the weights of Al and GaAs, total grown layer thickness (total thickness of layers 9, 8, and 7), light emission efficiency, and manufacturing yield, respectively obtained through experiments by the inventors.

TABLE 1

| AlAs mixed crystal ratio of clad ($X_{Al}$) | Al *(g) | GaAs *(g) | Total Grown Thickness ($\mu$m) | Light Emission Efficiency (0.3 mm × 0.3 mm, 20 mA) | Yield (%) |
|---|---|---|---|---|---|
| 0.7 | 1.08 | 11.6 | 150 | 0.5 | 90 |
| 0.75 | 1.36 | 10.0 | 130 | 0.9 | 90 |
| 0.8 | 1.77 | 8.3 | 120 | 1.6 | 85 |
| 0.825 | 2.07 | 7.5 | 150 | 2.6 | 90 |
| 0.85 | 2.46 | 8.7 | 80 | 1.9 | 50 |
| 0.9 | 3.83 | 5.0 | 50 | 2.0 | 20 |

*For Ga 150 g

Figure 9:
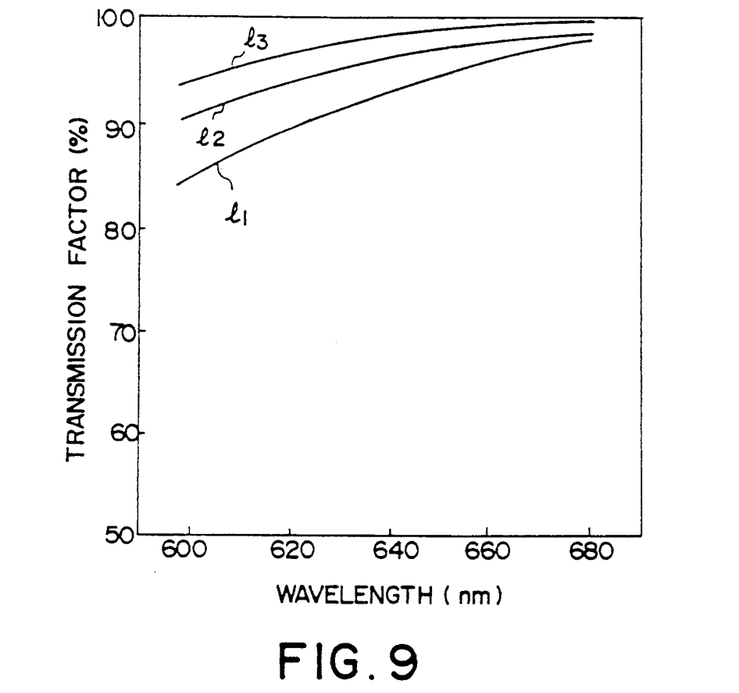
FIG. 9 shows characteristic curves of a transmission factor relative to wavelength, using an AlAs mixed crystal ratio as a parameter.

The pellet manufactured in the above-described manner is assembled as a product with the n-type GaAlAs clad layer 7 positioned upward. Therefore, it is important that the light transmission factor of the n-type GaAlAs clad layer 7 be made as large as possible. The characteristic curves $l_1$, $l_2$, and $l_3$ shown in FIG. 9 indicate the light transmission factors of semiconductor layers having AlAs mixed crystal ratios of 0.6, 0.7, and 0.8, respectively. As seen from FIG. 9, in order to increase the light transmission factor, it is better to use a semiconductor layer having a large AlAs mixed crystal ratio. However, if this ratio is too large, it is impossible to form a stable ohmic contact electrode because of surface oxidation, or the like. From the data obtained in experiments performed by the inventors, it has been found that an appropriate AlAs mixed crystal ratio of the n-type GaAlAs clad layer 7 is 0.75 to 0.85.

Figure 10:
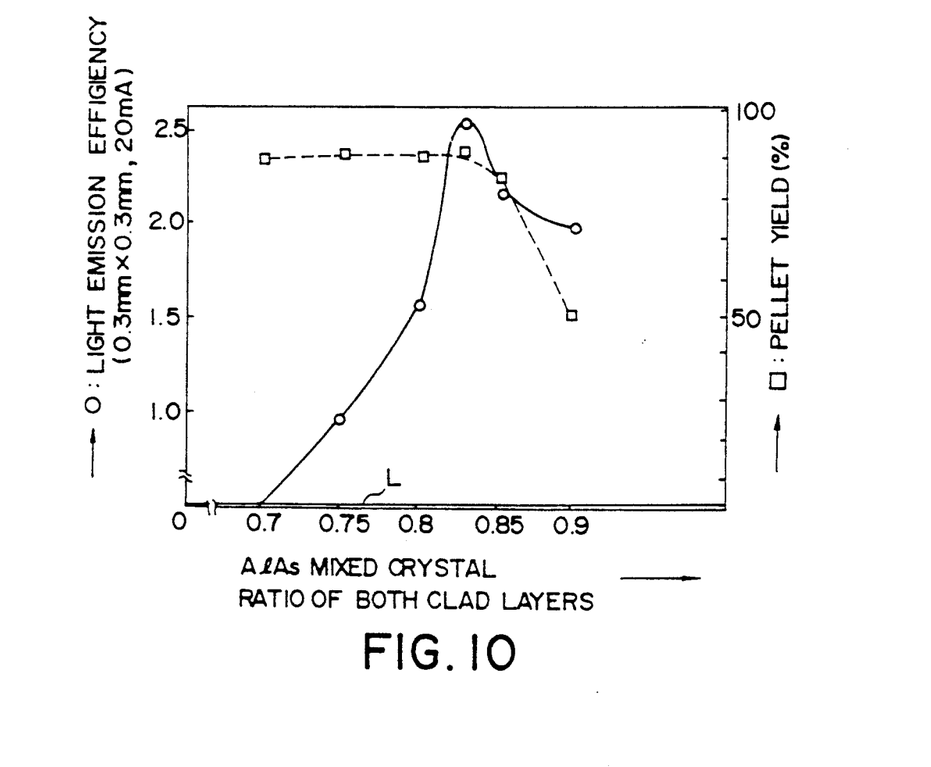
FIG. 10 shows characteristic curves of light emission efficiency and pellet yield, corresponding to Table 1.

FIG. 10 shows the light emission efficiency and pellet manufacturing yield relative to the AlAs mixed crystal ratios of the clad layers 9 and 7 shown in Table 1, the data being obtained from the results of experiments performed by the inventors. As is apparent from Table 1 and FIG. 10, the light emission efficiency is improved as the AlAs mixed crystal ratio increases. The total grown layer thickness decreases as the AlAs mixed crystal ratio increases. The pellet manufacturing yield rapidly lowers as the AlAs mixed crystal ratio increases. The reasons for a rapid lowering of the pellet manufacturing yield are as follows. Since the total grown layer thickness becomes thin, so that the layer is likely to be cracked during handling. In addition, it becomes difficult to stably form an ohmic contact electrode because of oxidation of the grown layer surface caused by a high mixed crystal ratio. There are also some other reasons.

As seen from the foregoing description, in order to obtain a device providing a high luminance with a high manufacturing yield, it is desirable that the AlAs mixed crystal ratios of the clad layers 9 and 7 be 0.75 to 0.85. The best yield obtained was at the AlAs mixed crystal ratio of 0.77 to 0.83.

The above data is for the device of the structure with the p-type GaAs substrate removed. Even for the device of the structure with the p-type GaAs substrate not removed, the light emission efficiency was improved to 0.6 to 0.9%, which is two to three times higher than that of a conventional GaAsP light emitting device.

Even if the emitted light wavelength is shortened by changing the AlAs mixed crystal ratio, luminance reduction can be prevented by setting the AlAs mixed crystal ratios of the clad layers to 0.75 to 0.85. The most stable and highest luminance can be obtained at high yield by setting the AlAs mixed crystal ratio to 0.77 to 0.83.

From the results of experiments made by the inventors shown in FIG. 10, it has been found that high light emission efficiency, not expected from conventional techniques, is obtained when the mixed crystal ratios of the clad layers 9 and 7 are set to 0.82. The light emission efficiency at the mixed crystal ratio $X_{Al}$ of 0.82 is 1.6 times that at a mixed crystal ratio of 0.80. The reason for this rise in the light emission efficiency is that the trapping effect is improved by increasing the AlAs mixed crystal ratios of the clad layers 9 and 7 to 0.82. Furthermore, by using a higher mixed crystal ratio $X_{Al}$ than a conventional one, the dependency on the thickness of the n-type clad layer 7 is reduced, so that even if the clad layer 7 is made thin, light emission is possible at high efficiency.

In the above description, the AlAs mixed crystal ratios are changed for both the p-type clad layer 9 and the n-type clad layer 7. However, the AlAs mixed crystal ratio of the n-type clad layer 7 influences the light emission efficiency more than the p-type clad layer 9. Therefore, even if the AlAs mixed ratio of the p-type clad layer 9 is fixed at 0.7 and the AlAs mixed crystal ratio of the n-type clad layer 7 is changed between the range of 0.7 to 0.9, excellent light emission efficiency, substantially the same as shown in FIG. 10, can be obtained.

In the above embodiment, the clad layers 9 and 7 are set to 0.75 to 0.85. It is also possible that the mixed crystal ratio of the p-type clad layer 9 as the first layer be set to 0.7, the mixed crystal ratio of the p-type active layer 8 as the second layer be set to 0.42, and the mixed crystal ratio of the n-type clad layer 7 as the third layer be set to 0.8. Also in this case, it is possible to improve the light emission efficiency as shown in FIG. 8.

The device constructed as above is manufactured in the following manner. Referring to FIG. 5, the layers 9, 8, and 7 are grown on the substrate 11 by using the growth solutions 9a, 8a, and 7a. The clad layer 7 is grown by using the growth solution 7a after the active layer 8 was grown by using the growth solution 8a. Assume a small amount of the growth solution 8a at the preceding stage not fully wiped out enters the growth solution 7a at the succeeding stage when the substrate 11 is transported thereto. Thus, at the start of growing the clad layer 7, growth is carried out by a mixture of two growth solutions of p-type and n-type. For example, it is assumed that the AlAs mixed crystal ratio $X_{Al}$ of the preceding stage growth solution 8a is 0.42 and that of the succeeding stage growth solution 7a is 0.8. In this case, at the start of growing the clad layer 7, the actual mixed crystal ratio $X_{Al}$ becomes, for example, 0.77. The clad layer 7 is therefore grown at a mixed crystal ratio lower than 0.8 at the start for several $\mu$m thickness, and thereafter it is grown stably at the mixed crystal ratio of 0.8. If the mixed crystal ratio $X_{Al}$ becomes lower than 0.8 at the start of growing the clad layer 7, the trapping effect of electrons implanted within the active layer 8 in the double hetero (DH) structure becomes weak (this effect becomes stronger as the difference becomes large between the mixed crystal ratio $X_{Al}$ of the active layer 8 and the ratios $X_{Al}$ of the clad layers 9 and 7). It can be understood therefore that the mixed crystal ratio $X_{Al}$ of the clad layer 7 should be prevented from being lowered. To this end, the mixed crystal ratios $X_{Al}$ of the solutions 9a and 7a used for growing the clad layers 9 and 7 are set to 0.81 or higher, preferably to 0.82, so that the clad layer 7 can be grown at a mixed crystal ratio of 0.80 or higher.

In the above embodiment, the liquid phase epitaxial growth method is used. The invention is not limited thereto, but a VG method or a MOCVD method can be also used.

As a modification of the present invention, each clad layer may be formed as a two-layer structure. For example, the n-type clad layer as the third layer may be constructed of an n-type lower clad layer in contact with the active layer and an n-type upper clad layer in contact with the ohmic contact electrode. Furthermore, the mixed crystal ratio of the lower clad layer is set to 0.75 to 0.85 in order to improve the carrier trapping effect. The mixed crystal ratio of the upper clad layer may be set to about 0.6 in order to prevent cracking during handling the device.

What is claimed is:

1. A light emitting device comprising:
    a first GaAlAs clad layer of a first conductivity type having a first AlAs mixed crystal ratio, said first GaAlAs clad layer serving as a first layer of said device;
    a GaAlAs active layer having a second AlAs mixed crystal ratio different from said first AlAs mixed crystal ratio, said second AlAs mixed crystal ratio being set to a value necessary for light emission having a wavelength within a range of 610 to 640 nm, said GaAlAs active layer serving as a second layer of said device; and
    a second GaAlAs clad layer of a second conductivity type having a third AlAs mixed crystal ratio different from said second AlAs mixed crystal ratio, said second GaAlAs clad layer serving as a third layer of said device,
    wherein said GaAlAs active layer of said first conductivity type serving as said second layer is sandwiched between said first GaAlAs clad layer of said first conductivity type serving as said first layer and said second GaAlAs clad layer of said second conductivity type serving as said third layer, to constitute a double hetero structure;
    wherein said second AlAs mixed crystal ratio of said GaAlAs active layer serving as said second layer is 0.40 to 0.56;
    wherein said first AlAs mixed crystal ratio of said first GaAlAs clad layer serving as said first layer and said third AlAs mixed crystal ratio of said second GaAlAS clad serving as said third layer are set to 0.77 to 0.83; and
    wherein the impurity concentration of said GaAlAs clad layer serving as said first layer is $0.5 \times 10^{17} cm^{-3}$ to $5 \times 10^{17} cm^{-3}$ next to said GaAlAs active layer serving as said second layer, and the impurity concentration of said GaAlAs clad layer serving as said third layer is $0.5 \times 10^{17} cm^{-3}$ to $4 \times 10^{17} cm^{-3}$ next to said GaAlAs active layer serving as said second layer.

2. A light emitting device according to claim 1, wherein the impurity concentration of said GaAlAs clad layer serving as said first layer is at least $5 \times 10^{17} cm^{-3}$ at the outer surface opposite to said GaAlAs active layer serving as said second layer, and the impurity concentration of said GaAlAs clad layer serving as said third layer is at least $5 \times 10^{17} cm^{-3}$ at the outer surface opposite to said GaAlAs active layer serving as said second layer.

3. A light emitting device according to claim 2, wherein the impurity concentration of said GaAlAs active layer serving as said second layer is $1 \times 10^{17} cm^{-3}$ to $8 \times 10^{17} cm^{-3}$.

4. A light emitting device according to claim 2, wherein the thickness of said GaAlAs clad layer serving as said first layer is 5 to 200 $\mu m$, the thickness of said GaAlAs active layer serving as said second layer is 0.1 to 5.0 $\mu m$, and the thickness of said GaAlAs clad layer serving as said third layer is 20 to 90 $\mu m$.

5. A light emitting device according to claim 3, wherein the thickness of said GaAlAs clad layer serving as said first layer is 5 to 200 $\mu m$, the thickness of said GaAlAs active layer serving as said second layer is 0.1 to 5.0 $\mu m$, and the thickness of said GaAlAs clad layer serving as said third layer is 20 to 90 $\mu m$.

6. A light emitting device according to claim 1, wherein said first conductivity type is a p-type and said second conductivity is an n-type.

7. A light emitting device according to claim 4, wherein said first conductivity type is a p-type and said second conductivity is an n-type.

8. A light emitting device according to claim 5, wherein said first conductivity type is a p-type and said second conductivity is an n-type.

9. A light emitting device according to claim 7, wherein an impurity added to said GaAlAs clad layer serving as said first layer is Zn, and an impurity added to said GaAlAs clad layer serving as said third layer is Te.

10. A light emitting device according to claim 8, wherein an impurity added to said GaAlAs clad layer serving as said first layer is Zn, and an impurity added to said GaAlAs clad layer serving as said third layer is Te.

11. A light emitting device according to claim 1, having epitaxially grown said first to third layers.

12. A light emitting device according to claim 4, having epitaxially grown said first to third layers.

13. A light emitting device according to claim 5, having epitaxially grown said first to third layers.

14. A light emitting device according to claim 1, wherein said first and third AlAs mixed crystal ratios are 0.82.

15. A light emitting device according to claim 13, wherein said first and third AlAs mixed crystal ratios are 0.82.

16. A light emitting device comprising:
    a first GaAlAs clad layer of a first conductivity type having a first AlAs mixed crystal ratio, said first GaAlAs clad layer serving as a first layer of said device;
    a GaAlAs active layer having a second AlAs mixed crystal ratio different from said first AlAs mixed crystal ratio, said second AlAs mixed crystal ratio being set to a value necessary for light emission having a wavelength within a range of 610 nm to 640 nm, said GaAlAs active layer serving as a second layer of said device; and
    a second GaAlAs clad layer of a second conductivity type having a third AlAs mixed crystal ratio different from said second AlAs mixed crystal ratio, said second GaAlAs clad layer serving as a third layer of said device,
    wherein said GaAlAs active layer of said first conductivity type serving as said second layer is sandwiched between said first GaAlAs clad layer of said first conductivity type serving as said first layer and said second GaAlAs clad layer of said second conductivity type serving as said third layer, to constitute a double hetero structure;

wherein said second AlAs mixed crystal ratio of said GaAlAs active layer serving as said second layer is 0.40 to 0.56; and wherein said third AlAs mixed crystal ratio of said second GaAlAs clad layer serving as said third layer is 0.75 to 0.85.

17. A light emitting device comprising:

a first GaAlAs clad layer of a first conductivity type having a first AlAs mixed crystal ratio, said first GaAlAs clad layer serving as a first layer of said device;

a GaAlAs active layer having a second AlAs mixed crystal ratio different from said first AlAs mixed crystal ratio, said second AlAs mixed crystal ratio being set to a value necessary for light emission having a wavelength within a range of 610 nm to 640 nm, said GaAlAs active layer serving as a second layer of said device; and a second GaAlAs clad layer of a second conductivity type having a third AlAs mixed crystal ratio different from said second AlAs mixed crystal ratio, said second GaAlAs clad layer serving as a third layer of said device, wherein said GaAlAs active layer of said first conductivity type serving as said second layer is sandwiched between said first GaAlAs clad layer of said first conductivity type serving as said first layer and said second GaAlAs clad layer of said second conductivity type serving as said third layer, to constitute a double hetero structure;

wherein said second AlAs mixed crystal ratio of said GaAlAs active layer serving as said second layer is 0.40 to 0.56; and wherein said first AlAs mixed crystal ratio of said first GaAlAs clad layer serving as said first layer and said third AlAs mixed crystal ratio of said second GaAlAs clad layer serving as said third layer are set to 0.77 to 0.83.

18. A light emitting device comprising:

a first GaAlAs clad layer of a first conductivity type having a first AlAs mixed crystal ratio, said first GaAlAs clad layer serving as a first layer of said device;

a GaAlAs active layer having a second AlAs mixed crystal ratio different from said first AlAs mixed crystal ratio, said second AlAs mixed crystal ratio being set to a value necessary for light emission having a wavelength within a range of 610 nm to 640 nm, said GaAlAs active layer serving as a second layer of said device; and a second GaAlAs clad layer of a second conductivity type having a third AlAs mixed crystal ratio different from said second AlAs mixed crystal ratio, said second GaAlAs clad layer serving as a third layer of said device, wherein said GaAlAs active layer of said first conductivity type serving as said second layer is sandwiched between said first GaAlAs clad layer of said first conductivity type serving as said first layer and said second GaAlAs clad layer of said second conductivity type serving as said third layer, to constitute a double hetero structure;

wherein said second AlAs mixed crystal ratio of said GaAlAs active layer serving as said second layer is 0.40 to 0.56; and wherein said first AlAs mixed crystal ratio of said first GaAlAs clad layer serving as said first layer and said third AlAs mixed crystal ratio of said second GaAlAs clad layer serving as said third layer are set to 0.77 to 0.83;

wherein the impurity concentration of said GaAlAs clad layer serving as said first layer is at least $5 \times 10^{17} cm^{-1}$ at the outer surface opposite to said GaAlAs active layer serving as said second layer, and the impurity concentration of said GaAlAs clad layer serving as said third layer is at least $5 \times 10^{17} cm^{-3}$ at the outer surface opposite to said GaAlAs active layer serving as said second layer.

19. A light emitting device according to claim 18, wherein the impurity concentration of said GaAlAs active layer serving as said second layer is $1 \times 10^{17} cm^{-3}$ to $8 \times 10^{17} cm^{-3}$.

20. A light emitting device according to claim 19, wherein the thickness of said GaAlAs clad layer serving as said first layer is 5 to 200 μm, the thickness of said GaAlAs active layer serving as said second layer is 0.1 to 5.0 μm, and the thickness of said GaAlAs clad layer serving as said third layer is 20 to 90 μm.

21. A light emitting device according to claim 20, wherein said first conductivity type is a p-type and said second conductivity is an n-type.

22. A light emitting device according to claim 21, wherein an impurity added to said GaAlAs clad layer serving as said first layer is Zn, and an impurity added to said GaAlAs clad layer serving as said third layer is Te.

23. A light emitting device according to claim 20, having epitaxially grown said first to third layers.

24. A light emitting device according to claim 23, wherein said first and third AlAs mixed crystal ratios are 0.82.

25. A light emitting device comprising:

a first GaAlAs clad layer of a first conductivity type having a first AlAs mixed crystal ratio, said first GaAlAs clad layer serving as a first layer of said device;

a GaAlAs active layer having a second AlAs mixed crystal ratio different from said first AlAs mixed crystal ratio, said second AlAs mixed crystal ratio being set to a value necessary for light emission having a wavelength within a range of 610 nm to 640 nm, said GaAlAs active layer serving as a second layer of said device; and a second GaAlAs clad layer of a second conductivity type having a third AlAs mixed crystal ratio different from said second AlAs mixed crystal ratio, said second GaAlAs clad layer serving as a third layer of said device, wherein said GaAlAs active layer of said first conductivity type serving as said second layer is sandwiched between said first GaAlAs clad layer of said first conductivity type serving as said first layer and said second GaAlAs clad layer of said second conductivity type serving as said third layer, to constitute a double hetero structure;

wherein said second AlAs mixed crystal ratio of said GaAlAs active layer serving as said second layer is 0.40 to 0.56; and wherein said first AlAs mixed crystal ratio of said first GaAlAs clad layer serving as said first layer and said third AlAs mixed crystal ratio of said second GaAlAs clad layer serving as said third layer are set to 0.75 to 0.85.

26. A light emitting device according to claim 25, wherein the impurity concentration of said GaAlAs clad layer serving as said first layer is $0.5 \times 10^{17} cm^{-3}$ to $5\times10^{17}$cm$^{-3}$ next to said GaAlAs active layer serving as said second layer, and the impurity concentration of said GaAlAs clad layer serving as said third layer is $0.5\times10^{17}$cm$^{-3}$ to $4\times10^{17}$cm$^{-3}$ next to said GaAlAs active layer serving as said second layer.

27. A light emitting device according to claim 26, wherein the impurity concentration of said GaAlAs clad layer serving as said first layer is at least $5\times10^{17}$cm$^{-3}$ at the outer surface opposite to said GaAlAs active layer serving as said second layer, and the impurity concentration of said GaAlAs clad layer serving as said third layer is at least $5\times10^{17}$cm$^{-3}$ at the outer surface opposite to said GaAlAs active layer serving as said second layer.

28. A light emitting device according to claim 27, wherein the impurity concentration of said GaAlAs active layer serving as said second layer is $1\times10^{17}$cm$^{-3}$ to $8\times10^{17}$cm$^{-3}$.

29. A light emitting device according to claim 28, wherein the thickness of said GaAlAs clad layer serving as said first layer is 5 to 200 μm, the thickness of said GaAlAs active layer serving as said second layer is 0.1 to 5.0 μm, and the thickness of said GaAlAs clad layer serving as said third layer is 20 to 90 μm.

30. A light emitting device according to claim 29, wherein said first conductivity type is a p-type and said second conductivity is an n-type.

31. A light emitting device according to claim 30, wherein an impurity added to said GaAlAs clad layer serving as said first layer is Zn, and an impurity added to said GaAlAs clad layer serving as said third layer is Te.

32. A light emitting device according to claim 29, having epitaxially grown said first to third layers.

33. A light emitting device according to claim 32, wherein said first and third AlAs mixed crystal ratios are 0.82.

* * * * *